(12) United States Patent
Morikawa et al.

(10) Patent No.: US 7,427,522 B2
(45) Date of Patent: Sep. 23, 2008

(54) SHORT-WAVELENGTH LASER MODULE AND METHOD OF PRODUCING THE SAME

(75) Inventors: Akihiro Morikawa, Osaka (JP); Yasuo Kitaoka, Ibaraki (JP); Kazuhisa Yamamoto, Takatsuki (JP); Shinichi Takigawa, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/991,560

(22) Filed: Nov. 18, 2004

(65) Prior Publication Data
US 2005/0094950 A1    May 5, 2005

Related U.S. Application Data

(62) Division of application No. 10/220,100, filed as application No. PCT/JP01/11525 on Dec. 27, 2001, now Pat. No. 6,847,660.

(30) Foreign Application Priority Data
Dec. 28, 2000   (JP) ............................ 2000-400441
Oct. 19, 2001   (JP) ............................ 2001-321677

(51) Int. Cl.
*H01L 21/00* (2006.01)
(52) U.S. Cl. .................. 438/22; 438/26; 257/80
(58) Field of Classification Search ............ 438/22, 438/26; 257/80
See application file for complete search history.

(56) References Cited

U.S. PATENT DOCUMENTS

| | | | | |
|---|---|---|---|---|
| 5,130,531 A | | 7/1992 | Ito et al. | |
| 5,175,784 A | * | 12/1992 | Enomoto et al. | 385/122 |
| 5,960,141 A | * | 9/1999 | Sasaki et al. | 385/88 |
| 6,181,854 B1 | * | 1/2001 | Kojima et al. | 385/49 |
| 6,282,350 B1 | * | 8/2001 | Takahashi et al. | 385/88 |
| 6,396,023 B1 | * | 5/2002 | Aikiyo | 219/117.1 |
| 6,448,583 B1 | * | 9/2002 | Yoneda et al. | 257/81 |
| 6,467,972 B2 | * | 10/2002 | Setoguchi | 385/88 |
| 6,478,477 B1 | * | 11/2002 | Yamaguchi | 385/80 |
| 6,496,469 B1 | | 12/2002 | Uchizaki | |

(Continued)

FOREIGN PATENT DOCUMENTS

EP    899987    3/1999

(Continued)

OTHER PUBLICATIONS

Japanese International Search Report for PCT/JP01/11525 dated Apr. 2, 2002, with English translation.

*Primary Examiner*—Steven Loke
*Assistant Examiner*—David Goodwin
(74) *Attorney, Agent, or Firm*—RatnerPrestia

(57) ABSTRACT

In a short-wavelength laser module, long-term reliability is lost because of unnecessary gas deposited on the end face of its optical waveguide. A short-wavelength laser module has a package structure wherein a package lid used when the short-wavelength laser module is hermetically sealed does not make contact with internal gas, and a process of accelerating the polymerization of a securing agent used inside the package is incorporated, whereby unnecessary gas from the securing agent is eliminated and the long-term reliability of the output is attained.

6 Claims, 10 Drawing Sheets

U.S. PATENT DOCUMENTS

| | | |
|---|---|---|
| 6,542,534 B1 | 4/2003 | Svilans |
| 6,579,737 B2 * | 6/2003 | Yoneda et al. ............... 438/22 |
| 6,638,686 B2 | 10/2003 | Sawada et al. |
| 6,707,679 B2 * | 3/2004 | Yang ........................ 361/752 |
| 6,715,934 B2 * | 4/2004 | Suzuki et al. ................ 385/88 |
| 6,739,764 B2 * | 5/2004 | Ido et al. .................... 385/92 |
| 6,847,660 B2 * | 1/2005 | Morikawa et al. ............ 372/5 |

FOREIGN PATENT DOCUMENTS

| | | |
|---|---|---|
| JP | 56-175878 | 12/1981 |
| JP | 63-181389 | 7/1988 |
| JP | 05-235484 | 9/1993 |
| JP | 06-082660 | 3/1994 |
| JP | 08-031968 | 2/1996 |
| JP | 08-78560 | 3/1996 |
| JP | 08-101416 | 4/1996 |
| JP | 2892889 | 2/1999 |
| JP | 11-74074 | 3/1999 |
| JP | 11-214152 | 8/1999 |
| JP | 11-295560 | 10/1999 |

* cited by examiner

SHORT-WAVELENGTH LASER MODULE AND METHOD OF PRODUCING THE SAME

This application is a divisional of U.S. patent application Ser. No. 10/220,100, filed Dec. 4, 2002, now U.S. Pat. No. 6,847,660, issued Jan. 25, 2005, which is a U.S. National Phase Application of PCT International Application PCT/JP2001/11525, filed Dec. 27, 2001.

TECHNICAL FIELD

The present invention relates to a short-wavelength laser module having a semiconductor laser housed in a package and outputting short-wavelength laser light and to a method of producing the laser module.

BACKGROUND OF TECHNOLOGY

In the optical device field, the hermetic sealing structure and hermetic sealing method of each optical device are important technologies to attain the long-term reliability of the optical device, and also in an optical waveguide wavelength conversion device, the hermetic sealing structure has become a very important factor, since it is necessary to protect against external humidity and dust for stabilization of the characteristic of an optical waveguide itself, stabilization of the characteristic of an optical semiconductor, such as a semiconductor laser, and attainment of long-term reliability.

In a hermetic sealing method in a conventional optical device, when a metallic package or a ceramic package is used in general, seam welding, such as resistance welding, can be applied between the main body of the package and the lid. For example, in the hermetic sealing method of an optical semiconductor module, as disclosed in Japanese Laid-open Patent Application No. Hei 6-82660, the module is configured so as to be hermetically sealed by seam-welding or soldering the upper face of the main body and the lid. By this seam-welding and soldering, sufficient hermeticity can be maintained inside the package. However, when it is considered that a light-emitting device, such as a semiconductor laser, is mounted on an optical pickup, it is important to reduce the weight and cost of the package itself; since the package formed of a resin, such as plastic, is lightweight and inexpensive, the resin is one of promising package materials. In the case when a resin package is used, a package sealing method using an adhesive, instead of the seam-welding or soldering, is most effective.

In the case when an adhesive is used for a method of sealing a package including a semiconductor laser and an optical waveguide wavelength conversion device that makes the wavelength of the light of the semiconductor laser short, in a conventional hermetically-sealing structure shown in FIG. 13, a lid portion securing agent 1302 on the A-face 1308 of FIG. 13 makes contact with gas hermetically sealed inside the package, whereby unnecessary gas 1306 evolved from the adhesive or unnecessary gas 1306 generated from the adhesive at the time of curing is mixed inside the package. In addition, an adhesive is used to secure an optical waveguide wavelength conversion device 1304 and a sub-mount 1305 inside the package, whereby unnecessary gas 1307 from the adhesive is also mixed inside the package just as in the case of securing the lid.

Conventionally, in the case of an incoherent incandescent lamp, a light-emitting diode, a long-wavelength semiconductor laser or the like, large energy is not concentrated near its light-emitting point, whereby the light-emitting point is not affected adversely. However, short-wavelength light emitted from a short-wavelength semiconductor laser, such as a blue laser, or an optical waveguide, is coherent light, and large energy of 10 kW/cm$^2$ or more is concentrated near the end face of the laser chip or the light-emitting point of the optical waveguide; therefore, the particles of the unnecessary gas are attracted thereto, and the unnecessary gas present inside the package are deposited on the end face of the chip or the end face of the optical waveguide, that is, the light emission portions, thereby causing the problem of lowering the optical output.

In addition, in the case when an ultraviolet curing resin is used as a package sealing and securing agent and an optical waveguide wavelength conversion device securing agent, bluish violet light or ultraviolet light emitted from the semiconductor laser or the optical waveguide reacts with outside gas, that is, unnecessary caused by the ultraviolet curing resin present in the atmosphere inside the package, and the unnecessary gas is further deposited significantly on the end face of the optical waveguide, thereby causing the problem of losing long-term reliability.

Furthermore, in the case when the optical waveguide wavelength conversion device is turned on continuously in the air atmosphere without being secured to the inside of the package, large energy is concentrated to the end face of the optical waveguide; therefore, foreign particles, such as dust, dirt and carbide, present in the air, are deposited on the end face of the blue light emission portion, thereby causing the problem of lowering the output of the blue light, deteriorating the transverse mode and losing the long-term reliability.

DISCLOSURE OF THE INVENTION

In order to solve the above-mentioned problems, the present invention is intended to provide a short-wavelength laser module capable of easing the lowering of performance due to an adhesive used during production, attaining output stability and having long-term reliability, and to provide a method of producing the laser module.

To achieve the above object, one aspect of the present invention is a short-wavelength laser module comprising:

a light-emitting device including at least a semiconductor laser and outputting short-wavelength laser light, a package body having a disposition face on which said light-emitting device is disposed and a wall face surrounding said disposition face, a lid portion joined to said package body, whereby a portion thereof, together with said disposition face and said wall face, forms housing space in which said light-emitting device is housed, and an adhesive used to bond said package body to said lid portion, wherein said package is joined to said lid portion so as to have a sealing face wherein they make close contact and are aligned with each other, and said sealing face is provided between said adhesive and said housing space.

Another aspect of the present invention is the short-wavelength laser module, wherein the wavelength of the short-wavelength laser light obtained by said light-emitting device is 450 nm or less.

Still another aspect of the present invention is the short-wavelength laser module, wherein said light-emitting device has wavelength converting means of converting the wavelength of the light output from said semiconductor laser into a length of 450 nm or less.

Yet still another aspect of the present invention is the short-wavelength laser module, wherein said semiconductor laser is a short-wavelength semiconductor laser outputting light having a wavelength of 450 nm or less.

Still yet another aspect of the present invention is the short-wavelength laser module, wherein at least portions, secured by said adhesive, of said lid portion have translucency, and said adhesive is cured by the irradiation of ultraviolet light.

A further aspect of the present invention is the short-wavelength laser module, wherein inert gas is sealed in said housing space.

A still further aspect of the present invention is the short-wavelength laser module, wherein said housing space is in a state of vacuum.

A yet further aspect of the present invention is the short-wavelength laser module, wherein said package body and/or said lid portion have a translucent light emission window.

A still yet further aspect of the present invention is the short-wavelength laser module, wherein said adhesive is provided at least at the joint portion between said package body and said lid portion, exposed to the outside of said short-wavelength laser module.

An additional aspect of the present invention is a method of producing a short-wavelength laser module comprising:

a first securing step of securing a light-emitting device including at least a semiconductor laser on a sub-mount using an adhesive that is cured by the irradiation of ultraviolet light, a second securing step of securing said sub-mount, on which said light-emitting device is secured, inside a package using an adhesive that is cured by heating, an ultraviolet irradiation step of irradiating ultraviolet light to accelerate the polymerization of said adhesive that is cured by the irradiation of said ultraviolet light, and a sealing step of sealing said package to hermetically seal the inside of said package.

A still additional aspect of the present invention is the method of producing a short-wavelength laser module, further comprising a heating step of carrying out additional heating concurrently with or after said ultraviolet irradiation step to accelerate the polymerization of said adhesive that is cured by said heating.

A yet additional aspect of the present invention is the method of producing a short-wavelength laser module, wherein the temperature at said heating step is higher than the temperature at said second securing step and lower than the operation temperature of said short-wavelength laser module.

A still yet additional aspect of the present invention is a communication apparatus having at least transmitting means of transmitting information in the form of light, wherein said transmitting means has the short-wavelength laser module.

In the present invention described above, for example, in the short-wavelength laser module comprising a semiconductor laser and an optical waveguide wavelength conversion device that halves the wavelength of its light, unnecessary gas generated from a package lid securing agent, an optical waveguide wavelength conversion device securing agent and a sub-mount securing agent used at the time of sealing is not affected by semiconductor laser light and harmonic light, whereby the long-term reliability of the output is attained during long-term continuous lighting.

Figure 1:
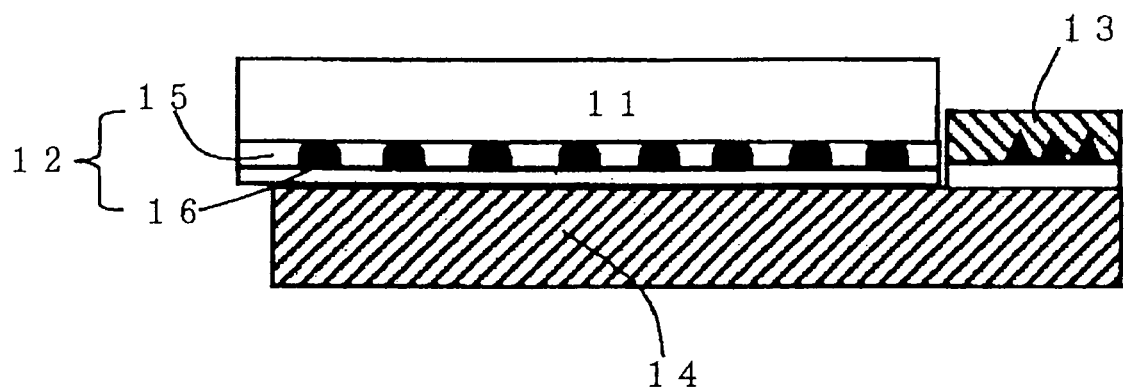
FIG. 1 is a view showing the configuration of the SHG blue light source of this embodiment.

EXPLANATION OF REFERENCE CODES 11 x-plate MgO-doped $LiNbO_3$ substrate
12 optical waveguide QPM-SHG device
13 variable wavelength semiconductor laser
14, 83 Si sub-mount
15 proton-exchange optical waveguide
16 periodic polarization inversion domain
31, 41, 1301 metallic package lid
32, 42, 202 adhesive
33, 43, 1303 metallic package body
34, 44, 205 cover glass piece
35, 45 close-contact portion
36, 46, 213 outer peripheral contact area
81 semiconductor laser
82 reflection face
201 lid portion
203 main body portion
204, 604, 1306 unnecessary gas
206 inner face of lid portion
210 outer fringe portion
211, B-face
212, 612 C-face
601 lid portion
602 ultraviolet curing agent
610 ultraviolet light
611 ultraviolet light irradiator
1302 lid portion securing agent
1304 optical waveguide wavelength conversion
1305 sub-mount
1307 unnecessary gas in package
1308 A-face

BEST MODE FOR CARRYING OUT THE INVENTION

Embodiments in accordance with the present invention will be described below referring to the drawings.

Embodiment 1

In Embodiment 1 of the present invention, an SHG blue light source is explained wherein an optical-waveguide Quasi-Phase-Matched Second-Harmonic-Generation (hereafter referred to as QPM-SHG) device produced on a MgO-doped LiNbO$_3$ substrate is used as an optical wavelength conversion device, and a variable wavelength semiconductor laser having a variable wavelength function is used as a semiconductor laser. In this embodiment, when the semiconductor laser and the optical waveguide wavelength conversion device that halves the wavelength of its light are hermetically sealed, a package structure wherein a lid securing agent is shut off from the inside of the package by a close-contact portion is used to attain the long-term reliability of the output during long-term continuous lighting.

FIG. 1 is a view showing the configuration of the SHG blue light source of this embodiment. The SHG blue light source corresponding to the light-emitting device of the present invention comprises an optical waveguide QPM-SHG device 12 and a variable wavelength semiconductor laser 13 corresponding to the semiconductor laser of the present invention, mounted on a Si sub-mount 14. The optical waveguide QPM-SHG device 12 comprises a proton-exchange optical waveguide 15 and a periodic polarization inversion domain 16 formed on an x-plate MgO-doped LiNbO$_3$ substrate 11. The periodic polarization inversion domain 16 is produced by forming a comb-shaped electrode on the +x face of the MgO:LiNbO$_3$ substrate and by applying an electric field. The difference between the propagation speed of the fundamental wave light and that of the second harmonic wave light is compensated for by the periodic polarization inversion domain 16, thereby satisfying a quasi-phase matching condition. Since the fundamental and harmonic waves propagate as waveguide light inside the proton-exchange optical waveguide 15, a long interaction length can be obtained, and high conversion efficiency can be attained.

Next, a hermetically sealing structure using the package of the SHG blue light source of this embodiment will be described. First, the variable wavelength semiconductor laser 13 is mounted accurately on the Si sub-mount 14 by soldering, and then the optical waveguide QPM-SHG device 12 is mounted accurately with respect to the variable wavelength semiconductor laser 13 by using an ultraviolet curing resin. Then, the Si sub-mount 14 is secured at the desired position on the main body of the package by using a thermosetting epoxy adhesive.

Next, the configuration of the package in which the SHG blue light source is housed will be described. FIG. 2(b) is a perspective view showing only the package, and FIG. 2(a) is a sectional view taken on line A-A' of FIG. 2(b). However, FIG. 2(a) also shows the cross-section of the SHG blue light source housed in the package.

As shown in FIGS. 2(a) and (b), the package comprises a main body portion 203 corresponding to the main body portion of the package of the present invention and a lid portion 201 corresponding to the lid portion of the present invention; the outer fringe portion 210 of the hollow in the main body portion 203, in which the SHG blue light source is housed, has a shape substantially identical to that of a C-face 212, that is, one of the faces of the inner face 206, having an L-shaped step in cross-section, of the lid portion 201, and the outer fringe portion 210 is positioned so as to be opposed to the C-face 212. The hollow in which the SHG blue light source is housed corresponds to the disposition face and wall face of the present invention. On the other hand, a B-face 211, that is, the other portion of the inner face 206 of the lid portion that is perpendicular to the C-face 212 and the other portion of the inner face 206 of the lid portion, is positioned so as to be opposed to the inner wall of the main body portion 203.

The lid portion 201 is joined to the main body portion 203 in which the SHG blue light source is housed so that the outer fringe portion 210 mates with the C-face 212. At this time, the B-face 211 of the lid portion 201 makes close contact with the inner wall of the main body portion 203, whereby the hollow inside the main body portion 203, in which the SHG blue light source is disposed, and the face, exposed to the space in which the SHG blue light source is disposed, of the lid portion 201 form a space in which the SHG blue light source is housed. This housing space corresponds to the housing space of the present invention.

An adhesive 202 for bonding and securing the main body portion 203 to the lid portion 201 is applied between the outer fringe portion 210 and the C-face 212; since the B-face 211 of the lid portion 201 makes close contact with the inner wall of the main body portion 203, the sealing face of the present invention is formed between the housing space and the adhesive 202; because of this sealing face, the adhesive 202 does not make contact with the atmosphere inside the housing space.

At this time, it is desirable that production is carried out so that the allowance of the distance from the B-face 211 to the B-face 211 on the side opposed thereto is +0.05 mm for the distance from the inner wall of the main body portion 203 to the inner wall on the side opposed thereto. Hence, at the sealing face, the close contact at the sealing face between the B-face 211 of the lid portion 201 and the inner wall of the main body portion 203 is enhanced at the time of hermetic sealing, and the adhesive 202 is sufficiently shut off from the atmosphere in the inside space of the package.

On the other hand, a cover glass piece 205 is secured to the emission face of the main body of the package by fusion bonding in advance, and the Si sub-mount 14 is secured in a direction wherein the blue light generated from the SHG blue light source is emitted perpendicularly with respect to the face of the cover glass piece 205.

Next, the assembly of the package described above will be explained. The lid portion 201 and the main body portion 203 in which the SHG blue light source is disposed are placed in an atmosphere sufficiently filled with N$_2$, and a state wherein the hollow of the main body portion 203 in which the SHG blue light source is disposed is sufficiently filled with N$_2$ is maintained. The lid portion 201 is then fitted in the main body portion 203; in a state wherein a sealing face is formed, the adhesive 204 is applied between the C-face 212 of the lid portion 201 and the outer fringe portion 210 of the main body portion 203, thereby bonding and securing the lid portion 201 to the main body portion 203. At this time, as an example of the adhesive 202, a two-component epoxy adhesive is applied to one or both of the C-face 212 and the outer fringe portion 210.

After the bonding is completed, pressure is applied. Then, the package is left for a certain period at room temperature, for example 24 hours, whereby the adhesive 204 is cured, and sufficient hermetic sealing is attained. The application of the adhesive 204 may be carried out before the lid portion 201 is fitted in the main body portion 203.

Figure 5:
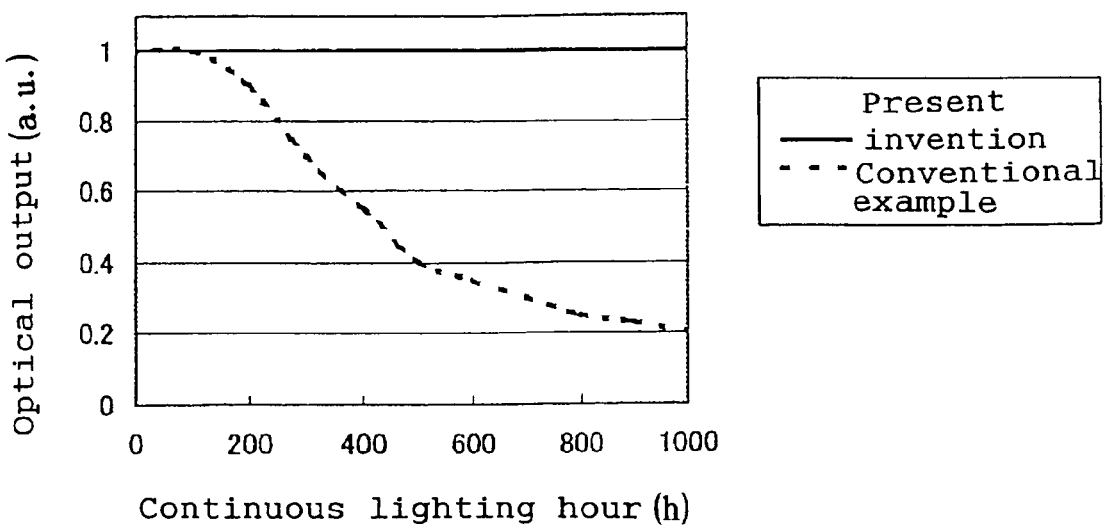
FIG. 5 is a graph showing a long-term reliability evaluation characteristic in Embodiment 1.
Figure 13:
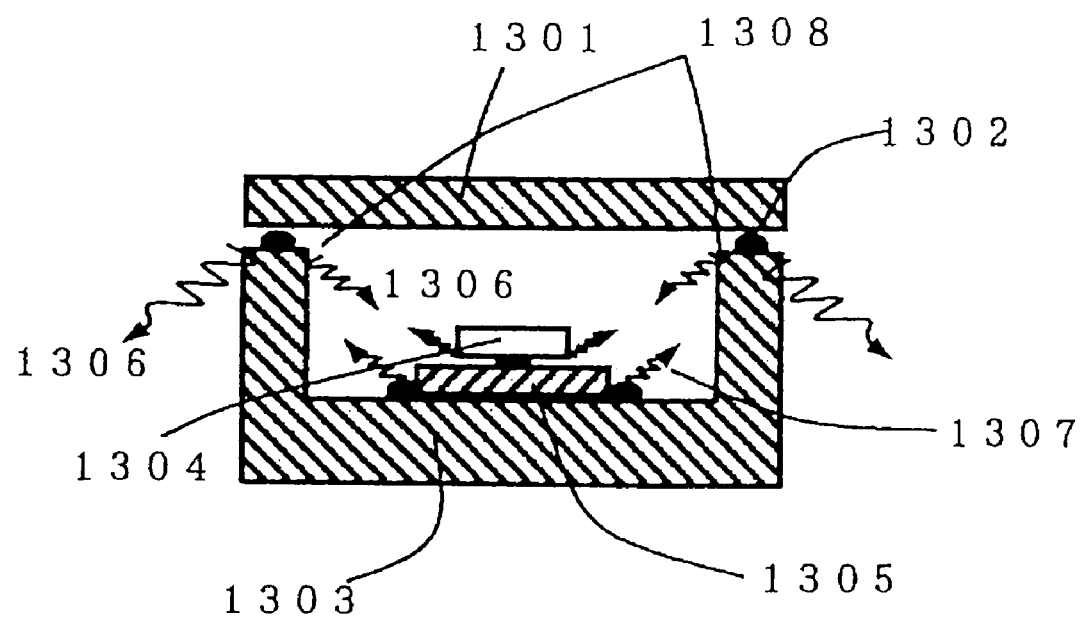
FIG. 13 is a sectional view showing the structure of the conventional package.

As an example of the lid portion 201, metal is used. In the package structure of the conventional example (FIG. 13), when a two-component epoxy adhesive was used to hermetically seal the SHG blue light source, the output reduction in the fundamental wave light and the blue light caused by the deposition of foreign particles on the end face of the optical waveguide was recognized after the continuous lighting of 5 mW blue light as shown in the graph of FIG. 5 because of unnecessary gas present inside the package; however, by using such a package structure as described in this embodiment, the deposition of foreign particles on the end face is not recognized after the continuous lighting of the 5 mW blue light, whereby long-term reliability for 1000 hours is attained.

As described above, in this embodiment, the lid portion 201 is provided with the B-face 211 and the C-face 212 so as to have an L-shaped structure; hence, it is possible to prevent the uncured portion of the adhesive or the cured adhesive from entering the inside of the package in which the SHG blue light source is disposed and from mixing in the atmosphere thereof. For this reason, unnecessary gas 204 is not deposited on the emission end face of the SHG blue light source, and the output reduction of the laser light does not occur.

In this embodiment, the deposition of foreign particles on the end face is prevented during the continuous lighting of the laser, whereby long-term reliability is attained, and its practical effect is significant.

Furthermore, in this embodiment, metal is used for the lid portion 201; however, even when glass or a resin material such as plastic is used, a similar sealing method can be attained, and it is preferable that the lid becomes more lightweight and inexpensive. Moreover, the adhesive is not limited to a two-component epoxy adhesive; a one-component thermosetting adhesive, a one-component cold setting adhesive, etc. may also be used.

In addition, the adhesive 202 may be applied to the whole outside peripheral contact area between the main body portion 203 and the lid portion 201. In this state, when viewed externally, the joint line between the main body portion 203 and the lid portion 201 is covered by the adhesive. This case is superior to the case wherein the adhesive is applied to some portions of the outside peripheral contact area with respect to reliability at the time of a heat cycle test or with respect to reliability against impact or the like, whereby its practical effect is significant.

Furthermore, in the above explanations, $N_2$ gas was used when the housing space was hermetically sealed; however, a different kind of gas, such as rare gas, may also be used, provided that the gas is inert gas. Furthermore, the inside of the housing space may be made vacuum without using gas. In this case, the intensity of the close contact at the sealing face is enhanced owing to the difference between the pressure inside the housing space and the pressure of the air at the package lid portion, whereby hermetic sealing is enhanced, making the mixture entry of the adhesive into the package difficult, and the effect of the present invention can thus be improved further.

Figure 3:
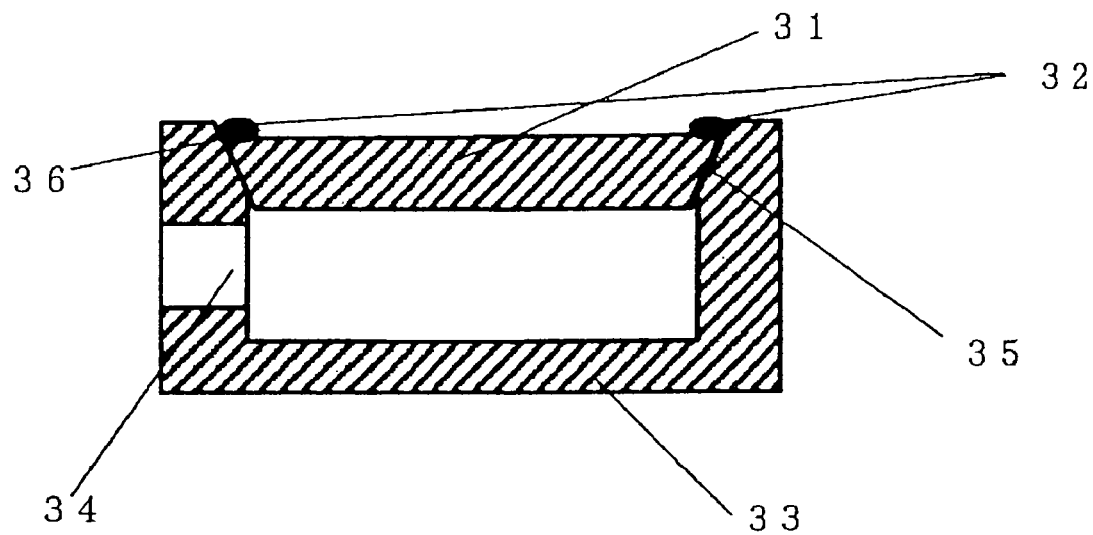
FIG. 3 is a sectional view showing a structure of the package of Embodiment 1.

Still further, the structure of the package is not limited to the configuration, having the L-shaped step in cross-section, of the lid portion 201; as shown in FIG. 3, a close contact face 35 wherein a main body portion 33 makes close contact with a lid portion 31 may also be formed to have a taper shape so as to be oblique with the inside wall of the main body portion 33. At this time, a lid portion securing agent 32 is applied so as to seal the joint line between the main body portion 33 and the lid portion 31, exposed at the lid portion.

In the case of the configuration shown in FIG. 3, the whole of the close contact face 35 forms the sealing face of the present invention; whereby the lid portion securing agent 32 can be shut off from the inside of the package, and the uncured portion of the lid portion securing agent 32 or unnecessary gas generated during curing does not enter the housing space inside the package. Furthermore, because of the taper shape, by increasing the amount of pressure application from the upper face of the lid portion 31, the close contact can be enhanced further in comparison with the structure shown in FIG. 2, thereby being more effective. Moreover, by securing the lid portion 31 while applying pressure, the shut-off of the close contact face 35 from the outside can be enhanced further, thereby being effective.

In addition, in the structure of the lid portion, even when the contact faces of a lid portion 41 and a main body portion 43 are made to have an L-shaped step structure as shown in FIGS. 4(a) and (b), a close contact portion 45 formed by the joining and close contact between the lid portion 41 and the main body portion 43 becomes a sealing face, and a lid portion securing agent 42 can be shut off from the inside of the package, whereby unnecessary gas generated from the lid portion securing agent 42 does not enter the inside of the package. In this case, by increasing the amount of pressure application just as in the case of the structure shown in FIG. 3, the close contact at the close contact portion can be enhanced further. Furthermore, this structure can be produced more easily than the structure of FIG. 3, thereby being more effective. In particular, in FIG. 4(a), a groove 450 is formed at the fringe portion of the lid portion 41, to which the lid portion securing agent 42 is applied, whereby the lid portion securing agent 42 can be applied more easily, thereby being more effective.

In addition, in this embodiment, the external shape of the package is a rectangular shape; however, the external shape of the package is not limited to a rectangular shape; a cubic shape, a polygonal shape, a semi-cylindrical shape, etc. may also be used. As the internal shape of the package, it is important to provide a securing portion between the main body portion and the lid portion by using the adhesive on the outside of the sealing portion wherein the main body portion makes close contact with the lid portion to prevent the outside gas of the securing agent from entering the inside of the package.

In short, in the present invention, the sealing face wherein the lid portion makes close contact with the main body of the housing should only be formed between the housing space formed by the lid portion and the main body of the housing and the adhesive used to bond the lid portion to the main body of the housing; hence, the sealing face is not limited by the outside shapes of the main body of the housing and the lid portion, the actual shape of the hollow of the main body in which the optical device is disposed, the actual configuration of the sealing face, the application position, the filling position of the adhesive, etc., or the like.

Embodiment 2

In this embodiment, when the semiconductor laser, the optical waveguide wavelength conversion device that halves the wavelength of its light and the Si sub-mount are hermetically sealed, an ultraviolet curing agent having intense reactivity in a short-wavelength range is used as a package lid securing agent. As a result, the long-term reliability of the output is attained during long-term continuous lighting, just as in the case of Embodiment 1.

Figure 2:
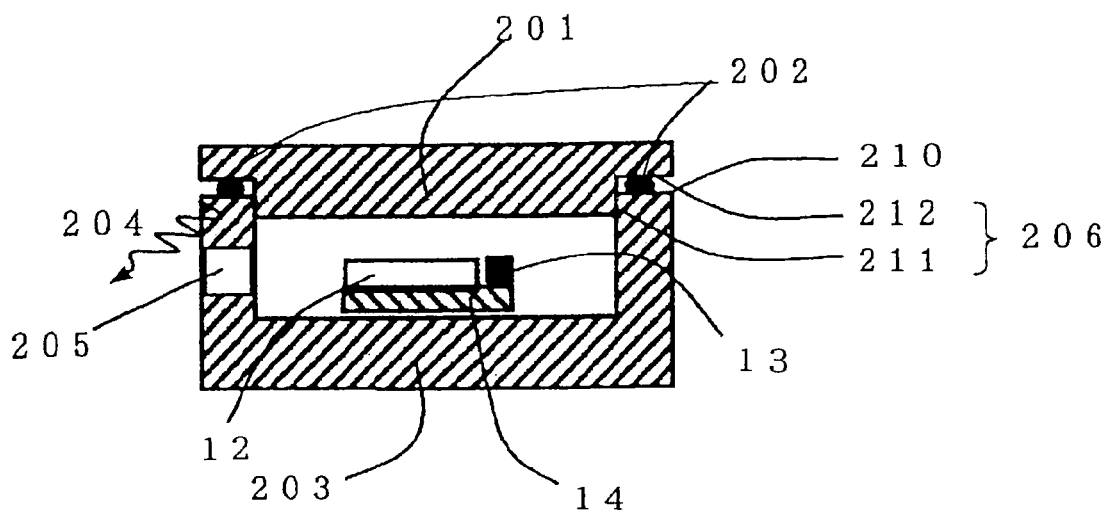
FIG. 2(a) is a sectional view showing a structure of the package of Embodiment 1.
FIG. 2(b) is a perspective view showing the structure of the package of Embodiment 1.
Figure 2:
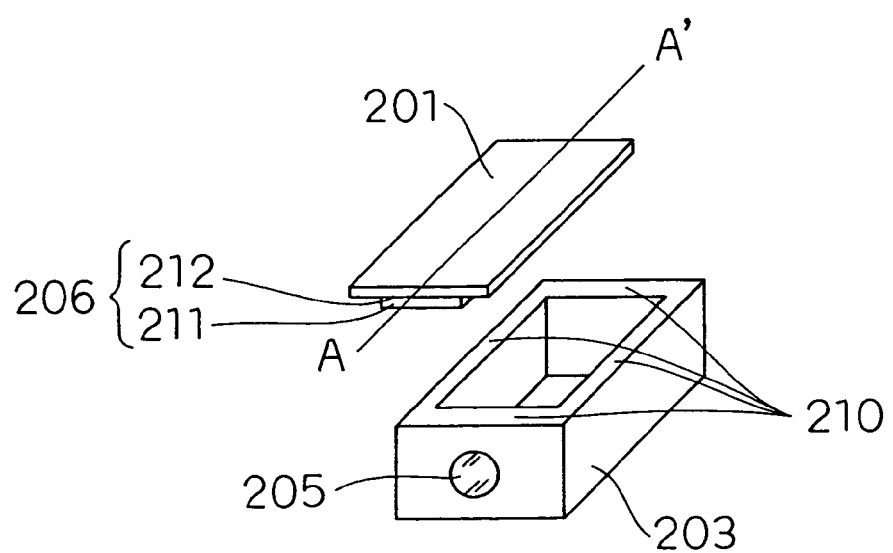
Figure 6:
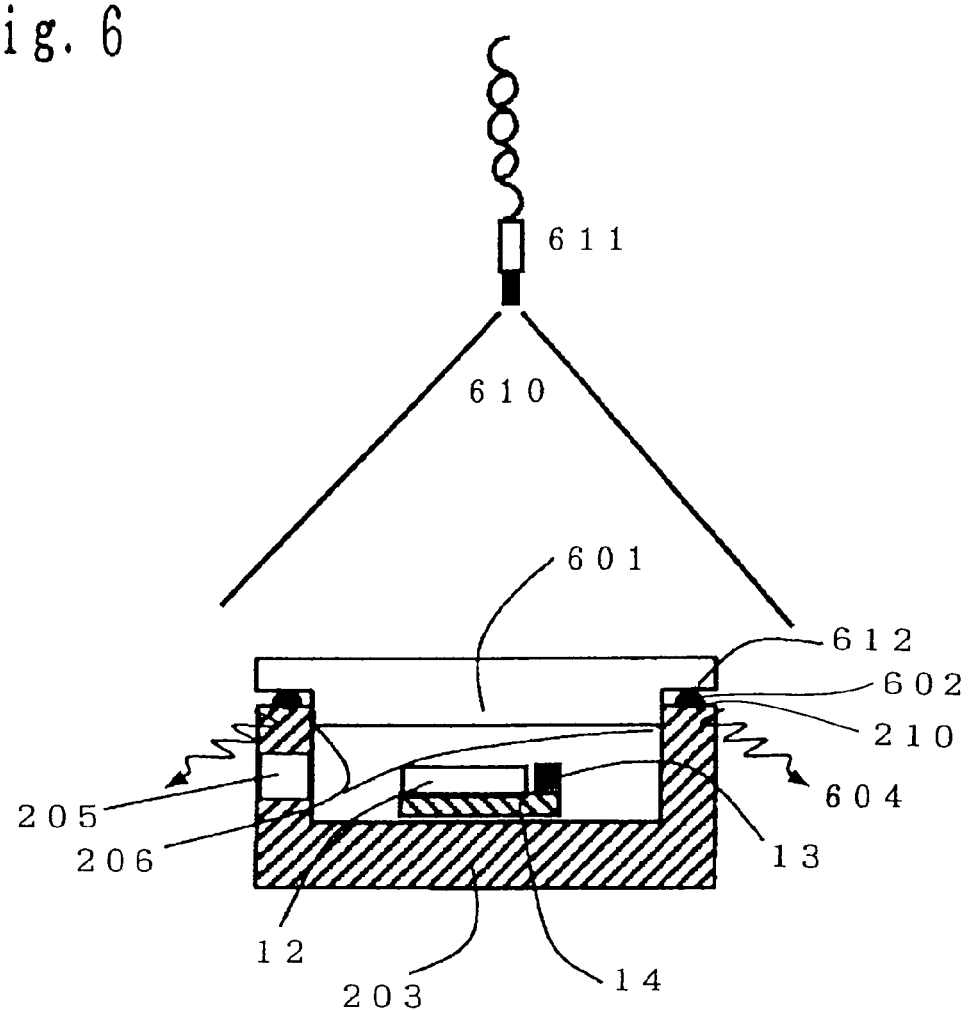
FIG. 6 is a sectional view showing a structure of the package of Embodiment 2.

A hermetically sealing structure using the package of the SHG blue light source of this embodiment will be described using FIG. 6. In the figure, the portions identical or corresponding to those shown in FIG. 2 are designated by the same reference codes, and their detailed explanations are omitted. In addition, a lid portion 601 is different in that it is made of a transparent material, such as a glass plate. Furthermore, even in this embodiment, just as in the case of Embodiment 1, an SHG blue light source is taken as an example, wherein an optical-waveguide QPM-SHG device produced on a Mgo-doped LiNbO₃ substrate is used as an optical wavelength conversion device, and a variable wavelength semiconductor laser having a variable wavelength function is used as a semiconductor laser.

Next, the assembly method of the package of this embodiment will be described using FIG. 6. Just as in the case of Embodiment 1, the optical-waveguide QPM-SHG device and the variable wavelength semiconductor laser mounted on the Si sub-mount are secured at the desired position on the main body of the package by using a thermosetting epoxy adhesive or the like.

Next, the main body of the package is placed in an atmosphere sufficiently filled with $N_2$ gas, and a state wherein the inside of the main body of the package in which the SHG blue light source is disposed is sufficiently filled with $N_2$ gas is maintained. The lid portion 601 is then fitted in the main body 203; in a state wherein a sealing face is formed, an ultraviolet curing agent 602 is applied between the C-face 612 of the lid portion 601 and the outer fringe portion 210 of the main body portion 203, the lid portion 601 is bonded to the main body 203, and pressure is applied. Furthermore, concurrently with the pressure application, ultraviolet light 610 is applied from an ultraviolet light irradiator 611 to the lid portion 601 of the package; the application is carried out centrally at each of two left and right positions for about 60 seconds to cure the ultraviolet curing agent 602, whereby the lid portion 601 is bonded and secured to the main body portion 203, and the inside of the main body portion of the package is hermetically sealed.

Since the configurations of the lid portion 601 and the main body 203 are similar to those of Embodiment 1, it is possible to prevent the uncured portion of the ultraviolet curing agent or the cured adhesive from entering the inside of the package in which the SHG blue light source is disposed and from mixing in the atmosphere inside the package. For this reason, unnecessary gas 604 is not deposited on the emission end face of the SHG blue light source, and the output reduction of the laser light does not occur.

In the case when the ultraviolet curing agent is used to hermetically seal a semiconductor laser of a wavelength of 450 nm or less, another visible light laser and an optical waveguide wavelength conversion device, the wavelength of the emitted light is not in a wavelength range wherein reaction with the ultraviolet curing agent occurs. However, when a light source of a short wavelength range of 450 nm or less is hermetically sealed just as in the case of this embodiment, the reactivity of the ultraviolet curing agent is enhanced as the wavelength becomes shorter. Hence, as clearly shown in FIG. 7, in the conventional package structure (FIG. 13), when the ultraviolet curing agent was used to hermetically seal the blue SHG light source, after the continuous lighting of the blue light, the output reduction of the fundamental wave light and the blue light due to the deposition of foreign particles on the end face of the optical waveguide was recognized.

Figure 7:
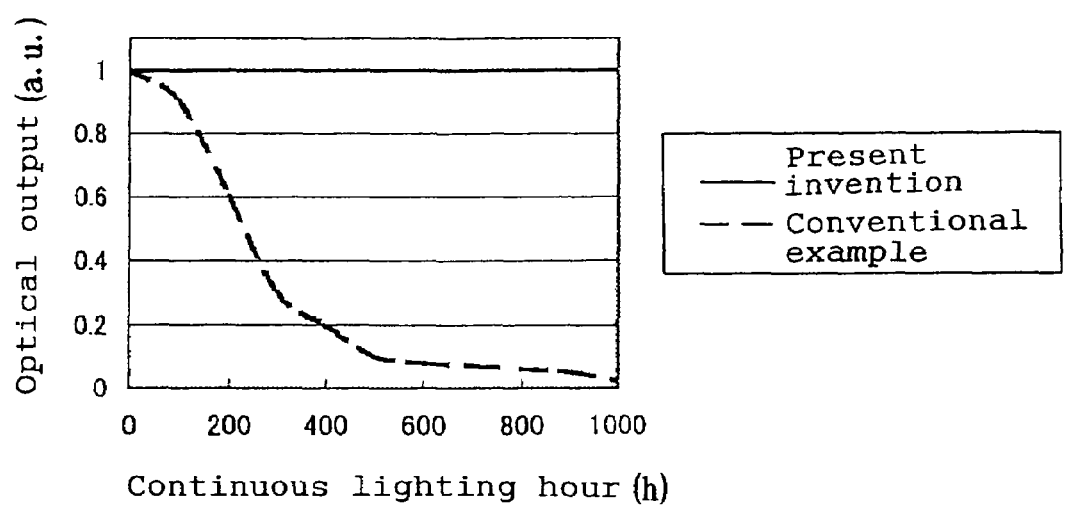
FIG. 7 is a graph showing a long-term reliability evaluation characteristic in Embodiment 2.

By using such a package structure as used in this embodiment, the deposition of foreign particles on the end face after the continuous lighting of blue light having an output of 5 mW was not recognized, whereby the long-term reliability of the semiconductor laser light and the blue light for 1000 hours was attained as shown in FIG. 7.

In this embodiment, the ultraviolet curing agent is used as a package lid securing agent; even in a short wavelength range of 450 nm or less wherein the reactivity with the ultraviolet curing agent is high, the deposition of foreign particles on the end face is prevented, whereby the long-term reliability of the wavelength-converted blue light is attained, and its practical effect is significant. In addition, in comparison with the adhesives, such as the two-component epoxy adhesive and the thermosetting adhesive of Embodiment 1, the ultraviolet curing agent has a very short curing time; hence, in the mass production of the short-wavelength laser modules, production time can be shortened, whereby its practical effect is significant.

Figure 4:
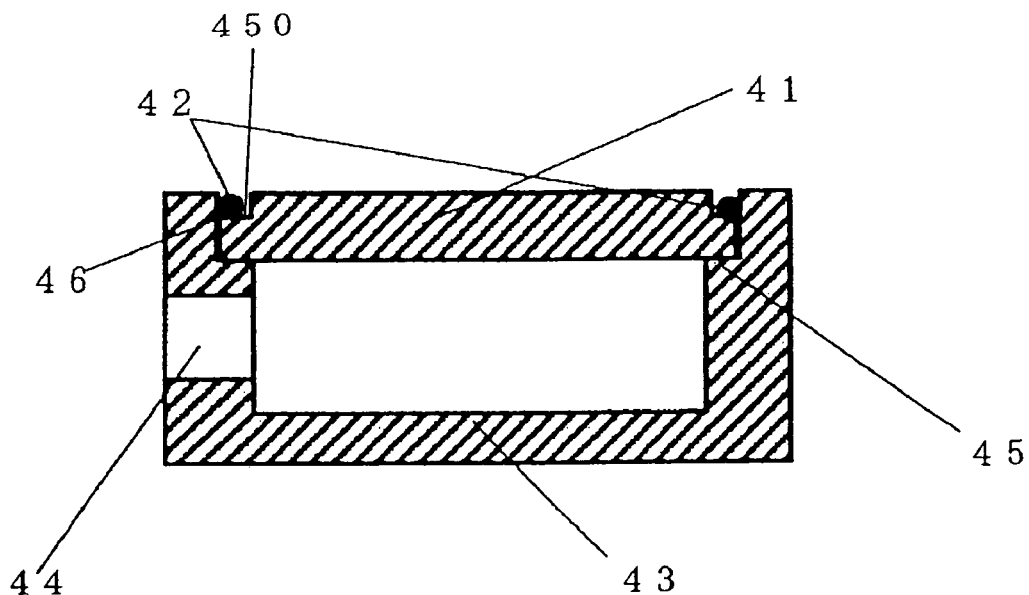
FIGS. 4(a) and 4(b) are sectional views showing structures of the package of Embodiment 1.
Figure 4:
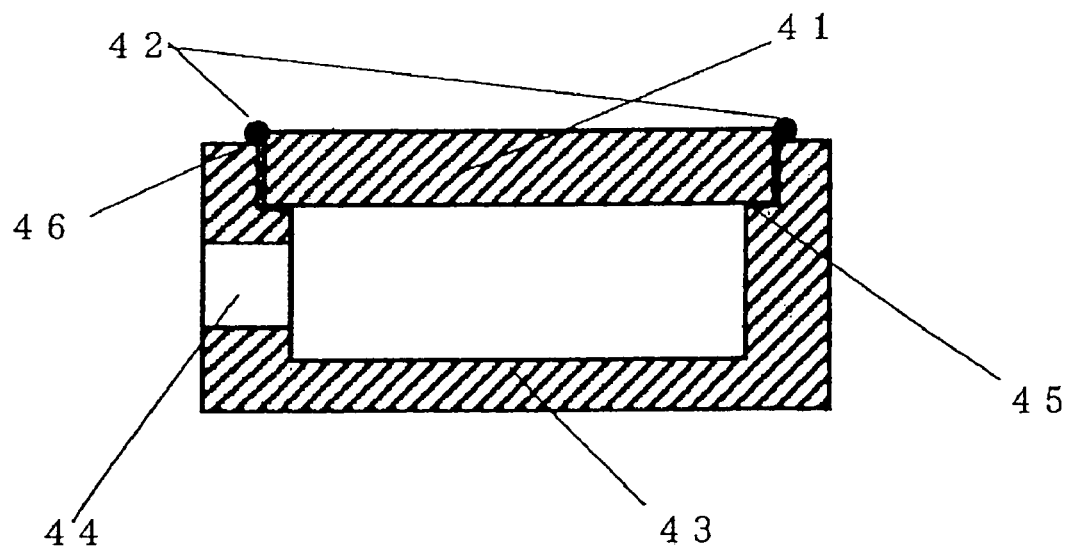

In this embodiment, the package having the structure of FIG. 2 in Embodiment 1 was used as the package; however, the package lids having structures shown in FIGS. 3 and 4 may be used, and hermetic sealing may be carried out while pressure is applied. In this case, the shut-off performance between the ultraviolet curing agent and the inside of the package is enhanced, whereby its practical effect is significant.

In addition, in this embodiment, a glass material is used for the lid portion 601; however, a resin material, such as plastic, may also be preferably used, provided that the material is transparent or somewhat translucent, for example 30% or more, in the wavelength range of the irradiator of the ultraviolet curing agent, since a similar sealing method can be used and its weight is made lighter.

Furthermore, in this embodiment, it was explained that the whole of the lid portion 601 is translucent; however, some portions of the lid portion of the present invention wherein the ultraviolet curing agent is irradiated should only be translucent.

Figure 8:
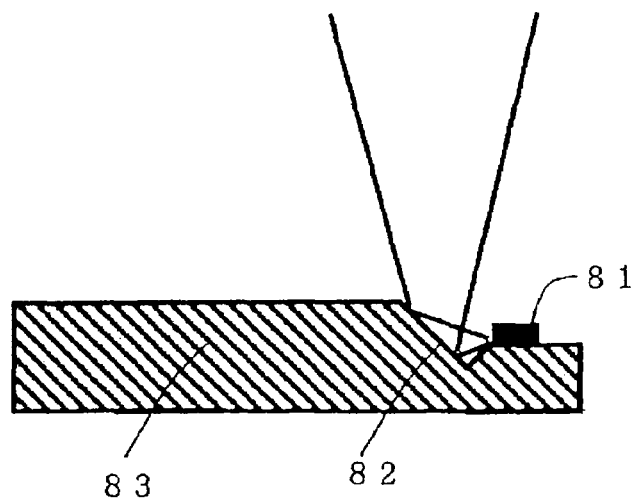
FIG. 8 is a view showing the configuration of a GaN semiconductor laser of this embodiment.

Still further, in the above-mentioned Embodiment 2, the SHG blue light source was used; however, a GaN semiconductor laser of a wavelength of 410 nm may also be used instead of the SHG blue light source, as the optical device of the present invention. As shown in FIG. 8, a GaN semiconductor laser 81 is mounted so as to be secured to a Si sub-mount 83 by soldering for example. The sub-mount 83 can be disposed just as in the case of Embodiment 2; as shown in FIG. 8, the light emitted from the GaN semiconductor laser 81 is reflected by a reflection face 82, delivered upward, and output from the transparent lid portion 601 to the lid portion.

The GaN semiconductor laser of a wavelength of 410 nm was hermetically sealed in each of the conventional package and the package of the present invention, and a long-term reliability test was carried out. As a result, in the case of the conventional package, the output reduction of light due to the deposition of foreign particles on the end face of the semiconductor chip was caused, just as in the case of the SHG blue light source; however, in the case of the package of this embodiment, the deposition of foreign particles on the end face of the semiconductor chip was not recognized, and the long-term reliability of the laser for 1000 hours was attained.

As described above, although the GaN semiconductor laser 81 outputs violet light, by using the GaN semiconductor laser in the configuration of the above-mentioned embodiment, the long-term reliability of the output can be attained during the long-term continuous lighting of the violet light.

Although it was mentioned that the wavelength of the GaN semiconductor laser was 410 nm, the wavelength may be different. In addition, the shape of the Si sub-mount is not required to be limited to that shown in FIG. 8, but the shape shown in FIG. 1 may also be used. In this case, the GaN semiconductor laser can be housed and used in the package having the configuration of Embodiment 1.

Embodiment 3

In this embodiment, by introducing a process of accelerating the polymerization of the securing agent that is used when the optical waveguide wavelength conversion device is secured to the Si sub-mount, the long-term reliability of the output is attained during the long-term continuous lighting of high-output blue light subjected to wavelength conversion. In this embodiment, just as in the case of Embodiment 1, it is explained that an SHG blue light source wherein an optical-waveguide QPM-SHG device produced on a MgO-doped LiNbO$_3$ substrate is used as an optical waveguide wavelength conversion device, and a variable wavelength semiconductor laser having a variable wavelength function is used as a semiconductor laser is used, and the SHG blue light source is mounted on the main body portion 201 of Embodiment 1.

Figure 9:
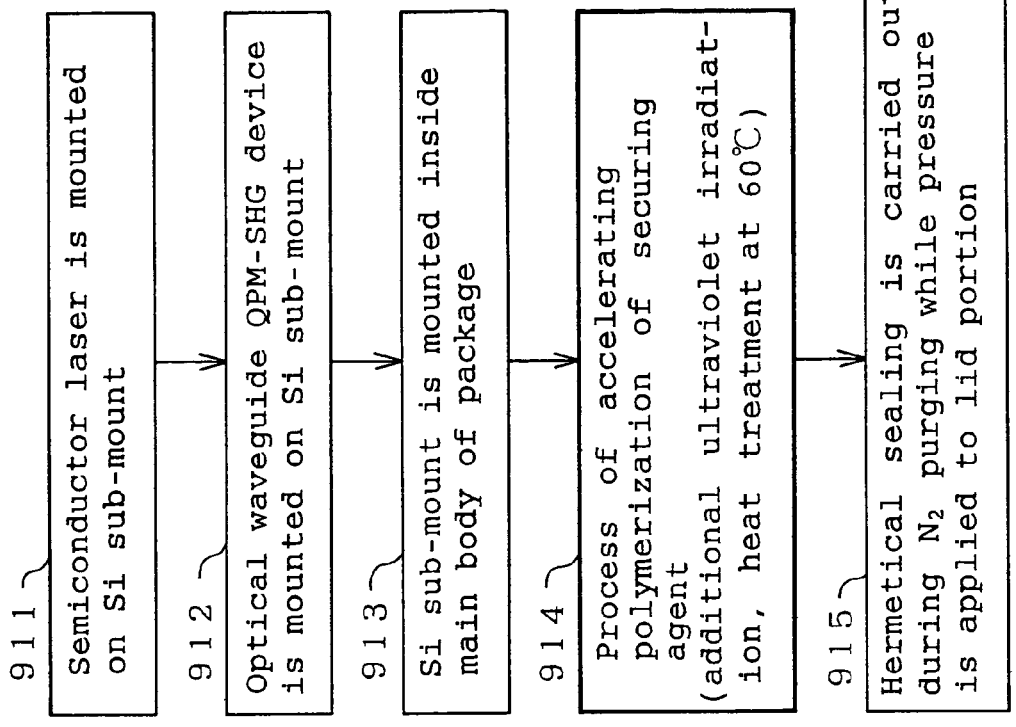
FIG. 9 is a production process chart for an SHG blue light source in Embodiment 4.
Figure 9:
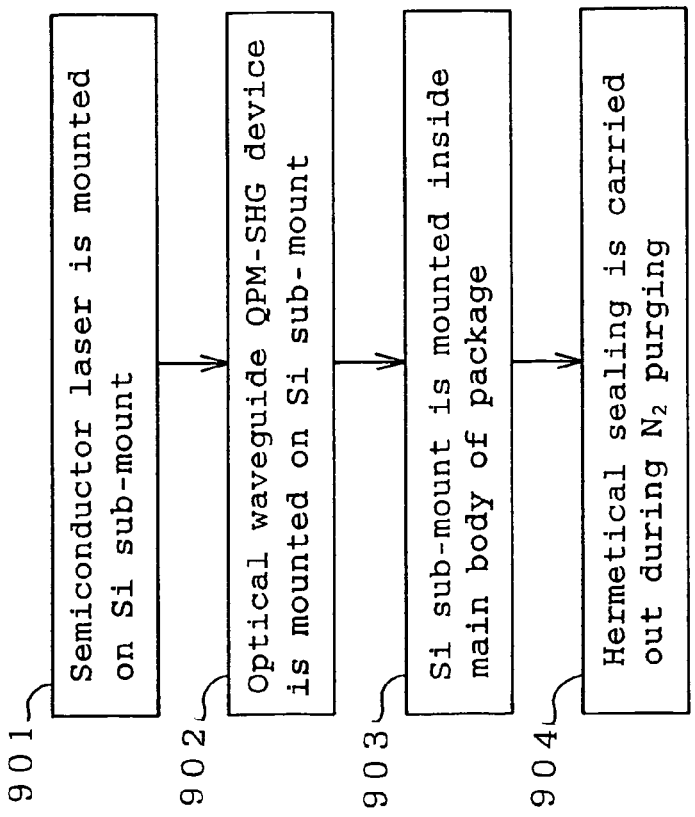

FIG. 9 shows a process of producing the SHG blue light source of this embodiment. First, the variable wavelength semiconductor laser 13 is mounted accurately on the Si sub-mount 14 by soldering (at 911), and then the optical waveguide QPM-SHG device 12 is mounted accurately with respect to the variable wavelength semiconductor laser 13 by using an ultraviolet curing resin (at 912). Then, the Si sub-mount 14 is secured at the desired position on the main body 203 by using a thermosetting epoxy adhesive (at 913). At this time, the cover glass piece 205 has been secured to the emission face of the main body 203 by fusion bonding, and the Si sub-mount is secured so that the emitted blue light is delivered perpendicularly with respect to the face including the cover glass piece 205.

Generally, the amount of unnecessary gas after the curing of the adhesive is less than that before the curing, and unnecessary gas is generated during the curing. Hence, the unnecessary gas generated from the ultraviolet curing resin used to secure the optical waveguide QPM-SHG device 12 and from the thermosetting epoxy adhesive used to secure the Si sub-mount 14 before and during the curing can be purged outside the main body 201 in a state wherein the space in which the Si sub-mount 14 is disposed is not hermetically sealed. However, even after the curing, residual unnecessary gas is present in the adhesive; hence, even a very small amount of the unnecessary gas may adversely affect the long-term reliability of the SHG blue light source after the completion.

In order to examine the influence of the residual unnecessary gas, by using an epoxy ultraviolet curing adhesive generating a relatively small amount of unnecessary gas to secure the SHG blue light source and by using an epoxy thermosetting adhesive to secure the Si sub-mount 12, the unnecessary gas after the continuous lighting of the laser was evaluated. At this time, an ultraviolet irradiation amount of about 3000 mJ (corresponding to the manufacturer recommended value) was used for ultraviolet curing, and as a method of curing the thermosetting resin, heat treatment was carried out at 60° C. for 1 hour in a constant temperature bath. In addition, the shape of the package and the method of the assembly thereof at the time of hermetic sealing are made identical to those of Embodiment 2.

EXAMPLE 1

First, when fundamental wave light (a wavelength range of 800 nm) was emitted continuously and the end face was observed, the deposition of foreign particles on the end face was not recognized, and the reliability of the fundamental wave was attained by using an adhesive generating a scarce amount of unnecessary gas. However, even when the adhesive generating a scarce amount of unnecessary gas was used, when the end face was observed after high-output blue light (a wavelength range of 400 nm and an output of 10 mW) was emitted continuously, the deposition of foreign particles was observed. It was presumed that this was caused by that the unnecessary gas from the adhesive remaining inside the package or the unnecessary gas generated from the uncured adhesive was deposited on the end face of the device; it was thus found that even in the epoxy adhesive generating a scarce amount of unnecessary gas, the existence of a small amount of unnecessary gas adversely affected the long-term reliability.

Figure 10:
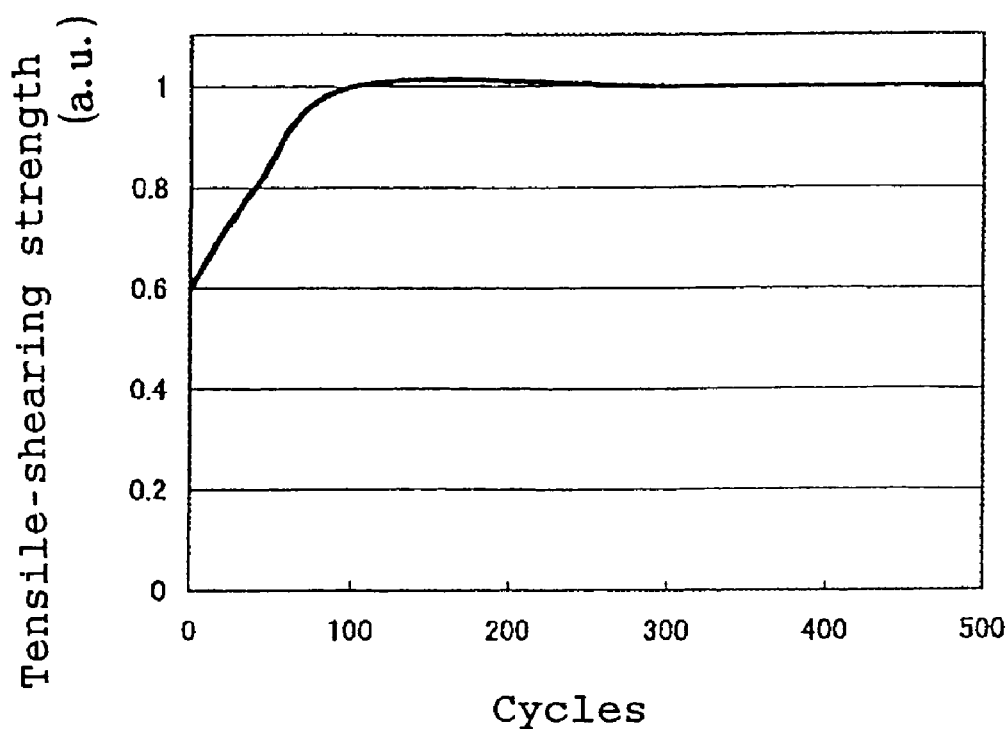
FIG. 10 is a graph showing an adhesion strength characteristic in a heat cycle test.

In addition, even after the curing of the adhesive, it was presumed that in the progress state of photo polymerization, the adhesive generated unnecessary gas during the photo polymerization, and the generated gas also caused adverse effect in this experiment. FIG. 10 shows an adhesion strength characteristic in a heat cycle test ranging from −40 to 85° C., and it is recognized that the adhesion strength increases in the range from 0 to 100 cycles. This is presumed that the polymerization of the adhesive was accelerated and the adhesion strength increased during the heat cycle test.

Furthermore, the absorption end of the SHG device (MgO-doped LiNbO$_3$ substrate) used as an adherent is 320 nm; a wavelength of 320 nm or less does not pass through when ultraviolet light is emitted to secure the SHG device using an ultraviolet curing agent. On the other hand, the curing wavelength of the ultraviolet curing agent varies depending on the adhesive; however, the curing wavelength of each adhesive is not limited to a single wavelength; an initiator is included so that curing occurs at a plurality of specific wavelengths in the ultraviolet to visible light ranges. However, in the case when a MgO-doped LiNbO$_3$ substrate is used as an adherent, an initiator that carries out polymerization at a wavelength of 320 nm or less cannot contribute to the curing of the adhesive. In other words, since the ultraviolet curing agent must be cured completely by an initiator that carries out polymerization at a wavelength of 320 nm or more, a sufficient irradiation amount of ultraviolet light is required. The ultraviolet curing agent used for this embodiment has an optimal curing wavelength of about 330 nm. Since the transmission factor of the MgO-doped LiNbO$_3$ substrate at a wavelength of 330 nm is about 50%, the integrated amount of the ultraviolet light applied to the ultraviolet curing agent is about half the integrated amount of the light emitted from an actual irradiator.

On the basis of this, in order to accelerate the polymerization of the adhesive and to completely remove unnecessary gas, after the SHG blue light source is secured, the additional application of ultraviolet light is carried out at the manufacturer recommended irradiation amount or more required for complete curing, that is, two times or more the recommended amount in this embodiment (6000 mJ or more, the manufacturer recommended value: 3000 mJ), and an unnecessary gas countermeasure step wherein heat treatment at 60° C. for 10 hours in a constant temperature bath after the securing of the Si sub-mount 14 is incorporated (at 914 of FIG. 9). The irradiation amount of the ultraviolet light at this time is an irradiation amount sufficient for the complete curing of the adhesive in consideration of the ultraviolet light transmission factor of the SHG device, and the heat treatment is carried out at the operation temperature (the operation temperature herein is room temperature of 25° C.) or more of the SHG blue light source, thereby eliminating the generation of unnecessary gas due to non-curing of the adhesive and the generation of unnecessary gas in the operation environment.

Figure 11:
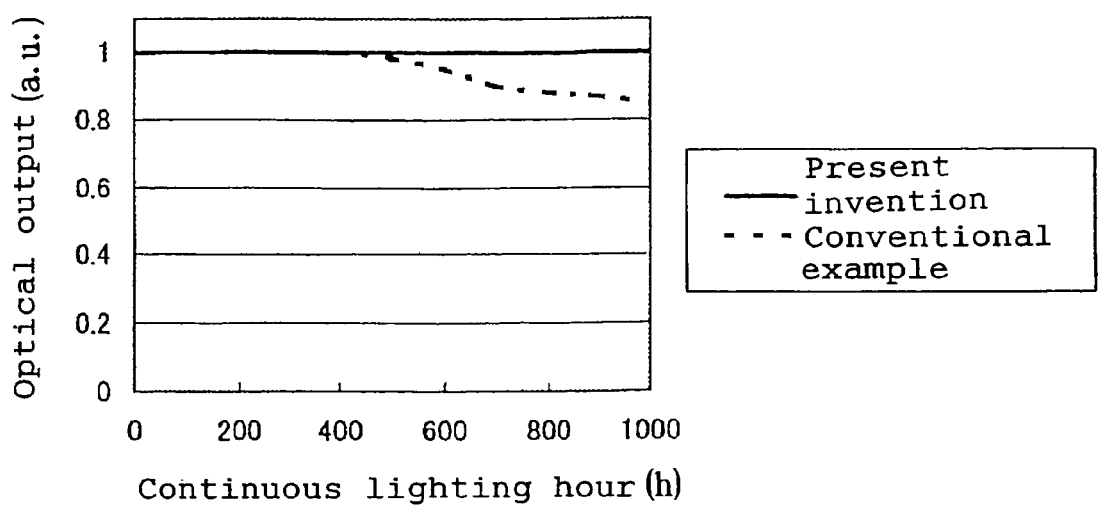
FIG. 11 is a graph showing a long-term reliability evaluation characteristic in Embodiment 4.

In addition, the influence of the optical waveguide portion on the optical waveguide QPM-SHG device 12 owing to thermal diffusion in the heat treatment at 60° C. for 10 hours, that is, the change in the refraction factor of the optical waveguide portion, is negligibly small; hence, the optical waveguide characteristic, that is, the optical output characteristic of the SHG blue light source depending on the reduction in the efficiency of the optical coupling to the optical waveguide does not change. As a result, as shown in FIG. 11, the deposition to the end face of the device was not recognized 500 hours after the continuous lighting of the blue light having an output of 10 mW, whereby the reduction of the output was eliminated, and the long-term reliability of the SHG blue light source at the time of high output is attained.

EXAMPLE 2

When the operating temperature and storage temperature of the SHG blue light source rise, it is necessary to set a heat treatment temperature so as to be higher than the operating temperature and storage temperature in order to prevent the generation of unnecessary gas; in addition, as the heat treatment process at that time, it is necessary to set a process wherein the influence due to thermal diffusion to the optical waveguide portion can be neglected. When using the SHG blue light source as an optical disc light source, it is necessary to use a heat treatment process of 85° C. or more, since the upper storage temperature is generally 85° C. The heat treatment process to eliminate unnecessary gas was carried out at 100° C. for 10 hours. The diffusion amount d at the waveguide due to heat diffusion at this time can be represented by $d=2\times[D(T)\times t]^{1/2}$ (D: a diffusion constant and a function of T, T: a heat treatment temperature, and t: a heat treatment time).

Usually, the heat treatment process at the time of producing a proton-exchange waveguide, such as the optical waveguide QPM-SHG device 12, is carried out at T=330° C. for t=3 hours; the diffusion amount in the case of the heat treatment process at T=100° C. for t=10 hours is less than that of the thermal diffusion in the case of the usual production of the proton-exchange waveguide by two orders of magnitude or more, and the diffusion amount is very small to the extent that the diffusion amount does not adversely affect the optical waveguide characteristic. In other words, this process can be used as a process not adversely affecting the optical waveguide characteristic and as a process of completely eliminating unnecessary gas. When the temperature of the heat treatment process is in the range of T=100 to 200° C., the optical waveguide characteristic is not adversely affected in the heat treatment process for about t=10 hours, and unnecessary gas can be eliminated, whereby a sufficient heat treatment process can be carried out at the upper storage temperature of t=200° C. or less.

In this embodiment, the configuration shown in FIG. 4(a) was used as the package, and a process of applying and curing the lid portion securing agent 42 while applying pressure to the lid portion 41 at the time of hermetic sealing was incorporated. The hermetic sealing was carried out by securing the lid portion 41 using the lid portion securing agent 42; however, it may be possible to use a hermetic sealing method wherein after the lid portion 41 is secured first using the lid portion securing agent 42, a cover glass piece 44, serving as a light emission window, of the main body portion 43 is fusion-bonded and secured in the end. In other words, even if unnecessary gas from the lid portion securing agent 42 used to secure the package lid is present inside the package, by carrying out the heat treatment process before the fusion-bonding, the unnecessary gas can be purged to the outside of the package from the light emission window portion in which the cover glass piece 44 is not yet installed, whereby its practical effect is significant.

In addition, the hermetic sealing was carried out by securing the lid portion 41 using the adhesive; however, as a package lid securing method, it may also possible to use a method wherein the entire peripheral portion of the lid portion, except for some portions, is filled with the adhesive, and the unfilled portions are filled in the end so as to be secured. Hence, even if unnecessary gas from the adhesive used to secure the package lid is present inside the package, the unnecessary gas can be purged from the unfilled portions to the outside of the package, whereby its practical effect is significant.

As described above, in this embodiment, by securing the optical waveguide QPM-SHG device 12 comprising the semiconductor laser and the optical waveguide wavelength conversion device directly connected to each other on the Si sub-mount to the inside of the hermetically sealed package, the end face of the SHG device is protected against dirt, dust and carbide present in the air atmosphere, whereby the long-term reliability of the output can be attained during the long-term continuous lighting of the high-output blue light subjected to wavelength conversion. In the SHG blue light source using the semiconductor laser and the optical wavelength conversion device, foreign particles present in the air are deposited on the emission end face during the continuous lighting, and the reduction of the output and the deterioration in the transverse mode are caused. So it has been a serious problem.

Figure 12:
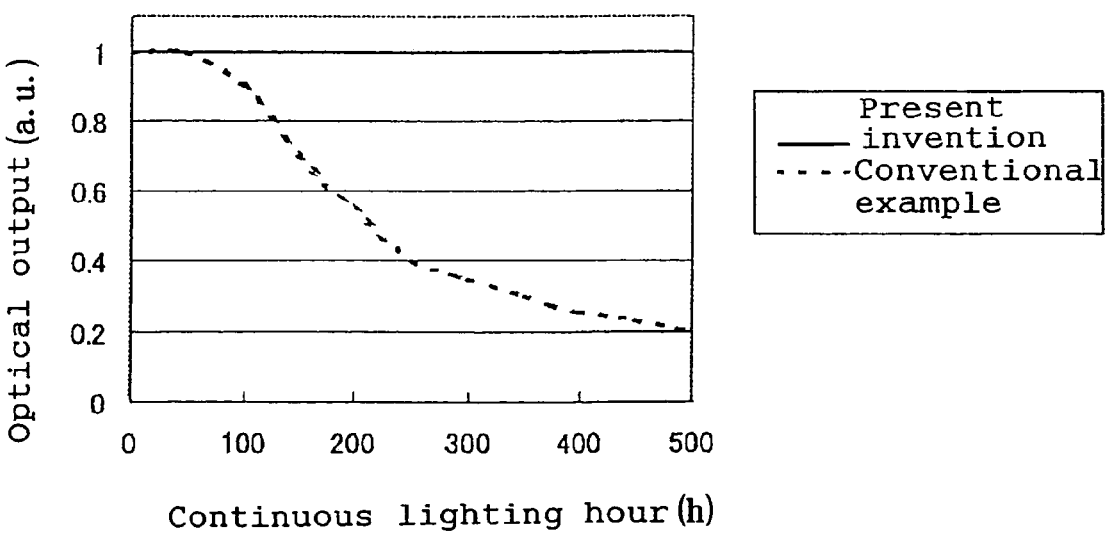
FIG. 12 is a graph showing a long-term reliability evaluation characteristic in Embodiment 4.

When the directly-coupled short-wavelength laser module, not hermetically sealed inside the package shown in FIG. 1, was turned on continuously in a state wherein the emission end face made contact with the air atmosphere without being hermetically sealed inside the package, foreign particles in the air were deposited on the emission end face, and as shown in FIG. 12, the output reduction of blue light and the deterioration in the transverse mode were caused. Hence, by hermetically sealing the short-wavelength laser module using the method of Embodiment 4, it is possible to prevent the deposition of the foreign particles in the air on the emission end and to prevent the deposition of outside gas generating from the securing agent described in Embodiment 4, whereby the long-term reliability of the output and in the transverse mode can be attained.

FIELD OF INDUSTRIAL APPLICATION

As described above, in accordance with the present invention, the reliability of the output during the long-term lighting of the short-wavelength light can be attained.

Furthermore, by eliminating the unnecessary gas generating from the securing agent at the time of producing the short-wavelength laser module, it is possible to prevent the deposition of the foreign particles on the emission end face of the optical device, whereby the long-term reliability of the output during the high-output lighting of blue light can be attained.

The invention claimed is:

1. A method of producing a short-wavelength laser module, the method comprising:
   a first securing step of securing an optical wavelength conversion device on a sub-mount using an adhesive that is cured by irradiation with ultraviolet light,
   a second securing step of securing said sub-mount, on which said optical wavelength conversion device is secured, inside a package using an adhesive that is cured by heating,
   an ultraviolet irradiation step of irradiating ultraviolet light to accelerate the polymerization of said adhesive that is cured by the irradiation with said ultraviolet light,
   a heating step of carrying out an additional heating concurrently with or after said ultraviolet irradiation step to accelerate the polymerization of said adhesive that is cured by said heating, and
   a sealing step of sealing said package to hermetically seal the inside of said package;

wherein the sealing step is carried out after the ultraviolet irradiation step and after the heating step; and wherein said package is sealed with a bonding adhesive and said bonding adhesive does not make contact with the atmosphere inside said package.

2. The method of producing a short-wavelength laser module in accordance with claim 1, wherein the temperature at said heating step is higher than the temperature at said second securing step and lower than the operation temperature of said short-wavelength laser module.

3. The method of producing a short-wavelength laser module in accordance with claim 1, wherein said package comprises a lid portion and a main body portion, said lid portion is a transparent material, and said lid portion is secured to said main body portion by said bonding adhesive that is cured by the irradiation with ultraviolet light.

4. The method of producing a short-wavelength laser module in accordance with claim 1, wherein:

said package comprises a lid portion and a main body portion, said lid portion is a transparent material, and said lid portion is secured to said main body portion by said bonding adhesive.

5. The method of producing a short-wavelength laser module in accordance with claim 1, wherein said bonding adhesive is a two-component epoxy adhesive.

6. The method of producing a short-wavelength laser module in accordance with claim 1, wherein the optical wavelength conversion device comprises an optical-waveguide quasi-phase-matched second-harmonic-generation device.

* * * * *